US010318689B2

(12) United States Patent
Antony et al.

(10) Patent No.: US 10,318,689 B2
(45) Date of Patent: Jun. 11, 2019

(54) INTEGRATED CIRCUIT LOGIC EXTRACTION USING CLONING AND EXPANSION FOR ENGINEERING CHANGE ORDER

(71) Applicant: International Business Machines Corporation, Armonk, NY (US)

(72) Inventors: George Antony, Kerala (IN); Ankit N. Kagliwal, Karnataka (IN); Sridhar H. Rangarajan, Bangalore (IN); Vinay K. Singh, Gorakhpur (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 78 days.

(21) Appl. No.: 15/486,961

(22) Filed: Apr. 13, 2017

(65) Prior Publication Data

US 2018/0300441 A1 Oct. 18, 2018

(51) Int. Cl.
 *G06F 17/50* (2006.01)
(52) U.S. Cl.
 CPC ............... *G06F 17/5054* (2013.01)
(58) Field of Classification Search
 USPC ........................................................ 716/102
 See application file for complete search history.

(56) References Cited

U.S. PATENT DOCUMENTS

| 2002/0162086 A1* | 10/2002 | Morgan | G06F 17/5045 716/102 |
| 2006/0271899 A1* | 11/2006 | Tan | G06F 17/5068 716/113 |
| 2007/0157150 A1* | 7/2007 | Ogami | G06F 8/70 716/128 |
| 2010/0175038 A1* | 7/2010 | Hopkins | G06F 17/504 716/126 |
| 2015/0242559 A1* | 8/2015 | Antony | G06F 17/5081 716/113 |
| 2016/0042107 A1 | 2/2016 | Fawaz et al. | |
| 2016/0364518 A1 | 12/2016 | Madiraju et al. | |

OTHER PUBLICATIONS

Fan, et al.; "Engineering Change Orders Design Using Multiple Variables Linear Programming for VLSI Design"; VLSI Design; vol. 2014; Aug. 2014;Hindawi Publishing Corporation; 6 pages.

* cited by examiner

*Primary Examiner* — Mohammed Alam
(74) *Attorney, Agent, or Firm* — Cantor Colburn LLP; Margaret McNamara

(57) ABSTRACT

A computer-implemented method for modifying an original design of an integrated circuit in accordance with an engineering change order (ECO) design includes cloning complex logic gate having multiple logic functions with cloned logic gates in parallel with the corresponding complex logic gates in the original design and the ECO design and expanding each cloned logic gate to corresponding base functionality logic gates to provide an expanded original design and an expanded ECO design using the processor. The method also includes modifying at least a portion of the expanded original design to have a circuit topology that is the same as the expanded ECO design in order to have an input from the expanded original design to an output structure be the same as the input from the expanded ECO design to the output structure in response to an expanded original design input and an expanded ECO design input being non-equivalent.

17 Claims, 10 Drawing Sheets

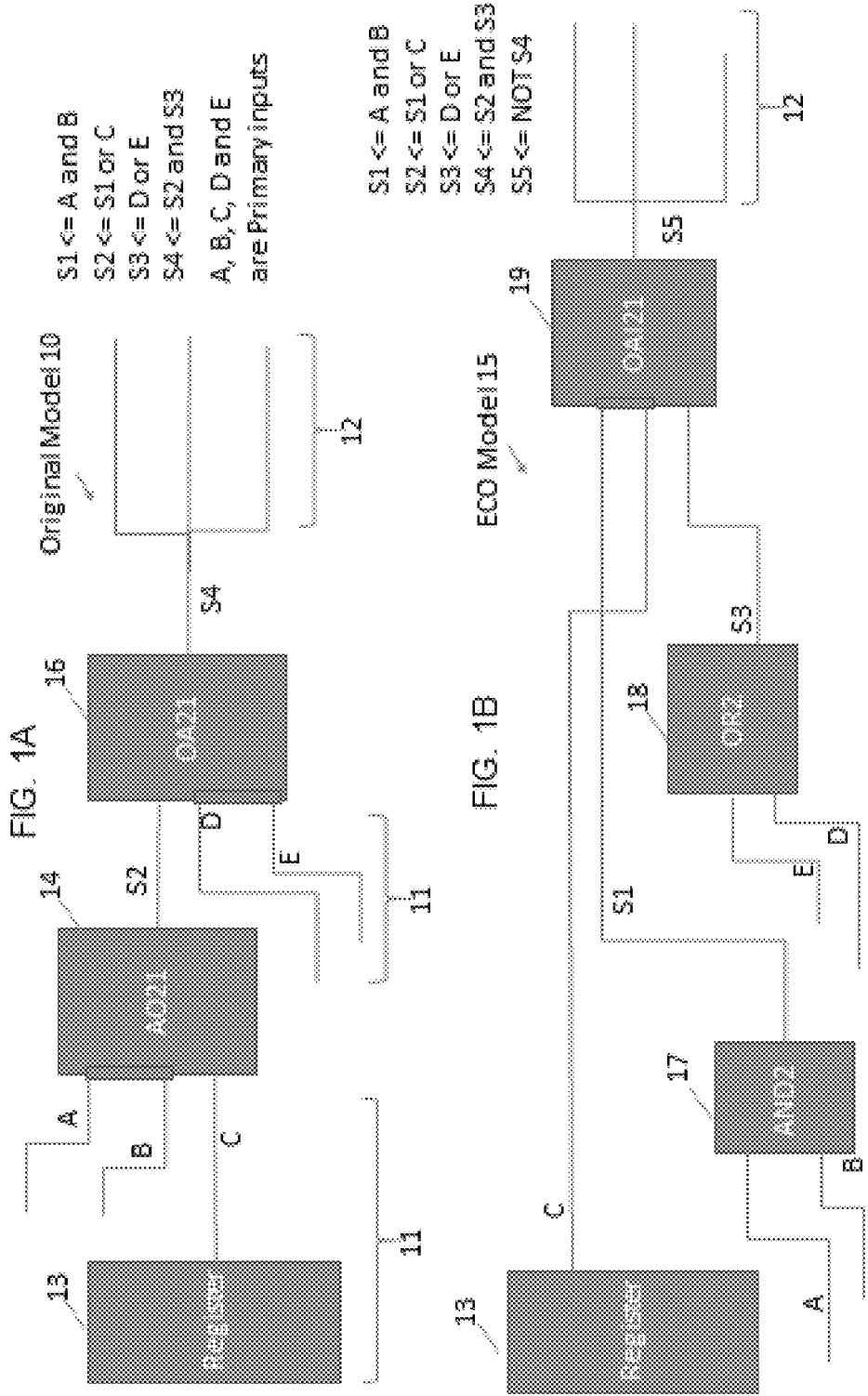

FIG. 2A

Original Model 10

FIG. 2B

ECO Model 15

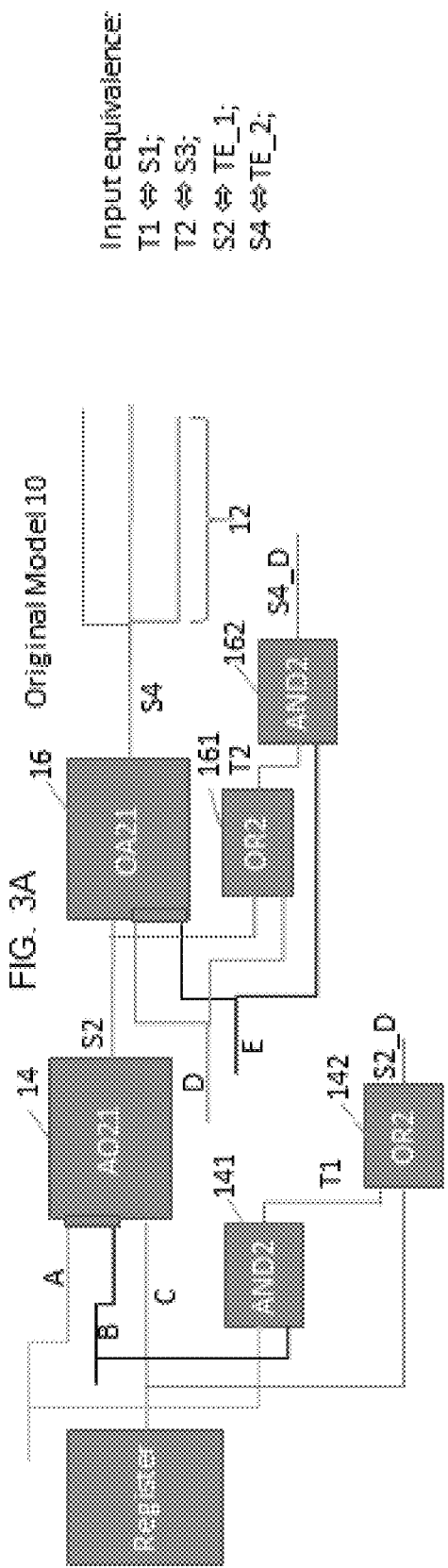
FIG. 3A Original Model 10
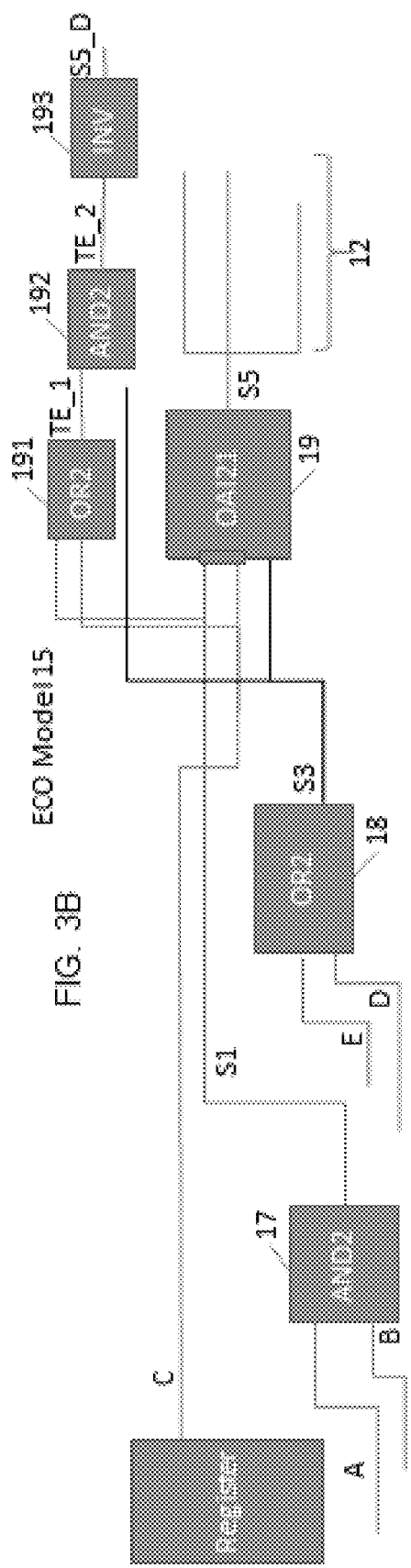
FIG. 3B ECO Model 15

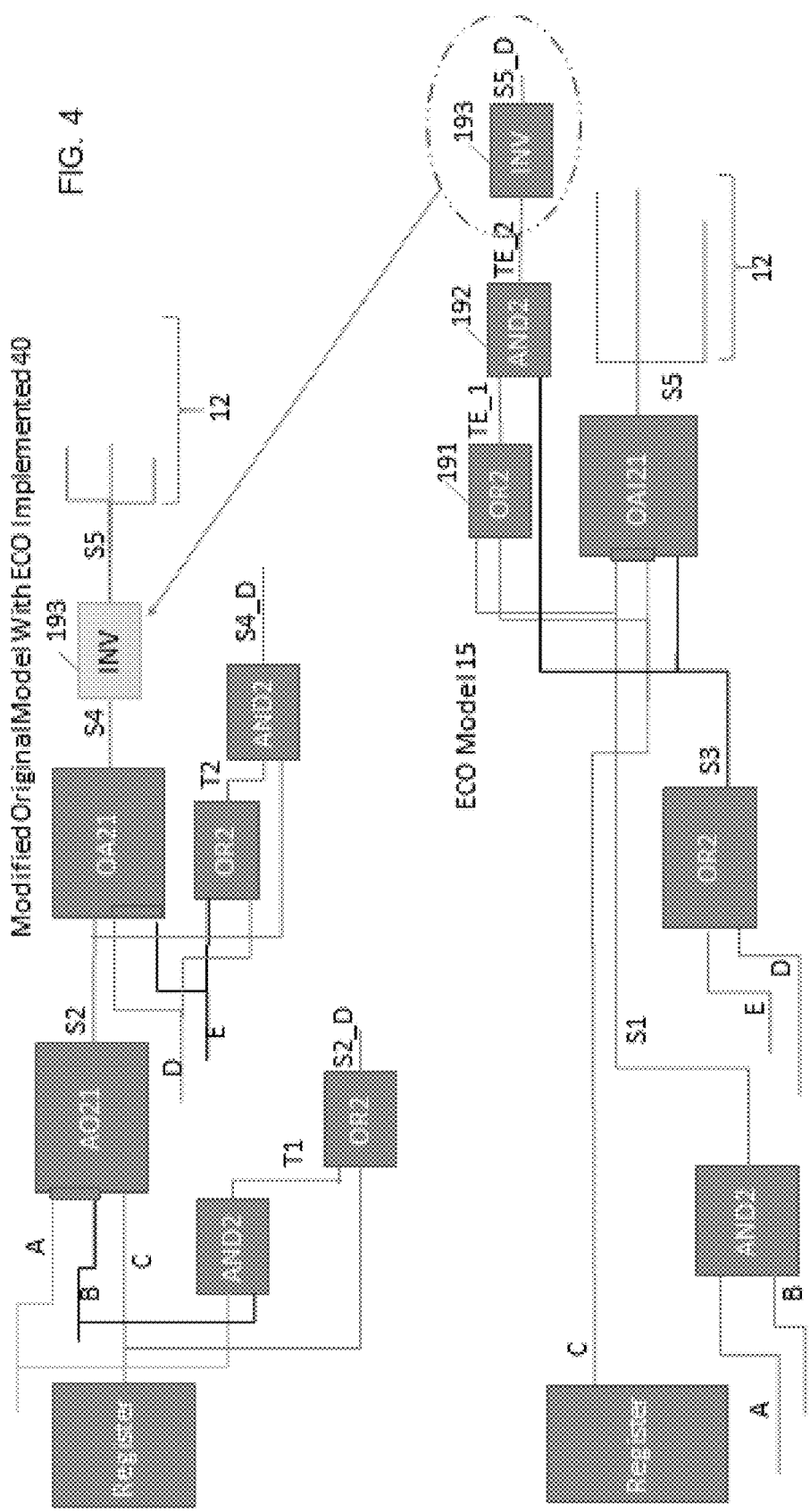

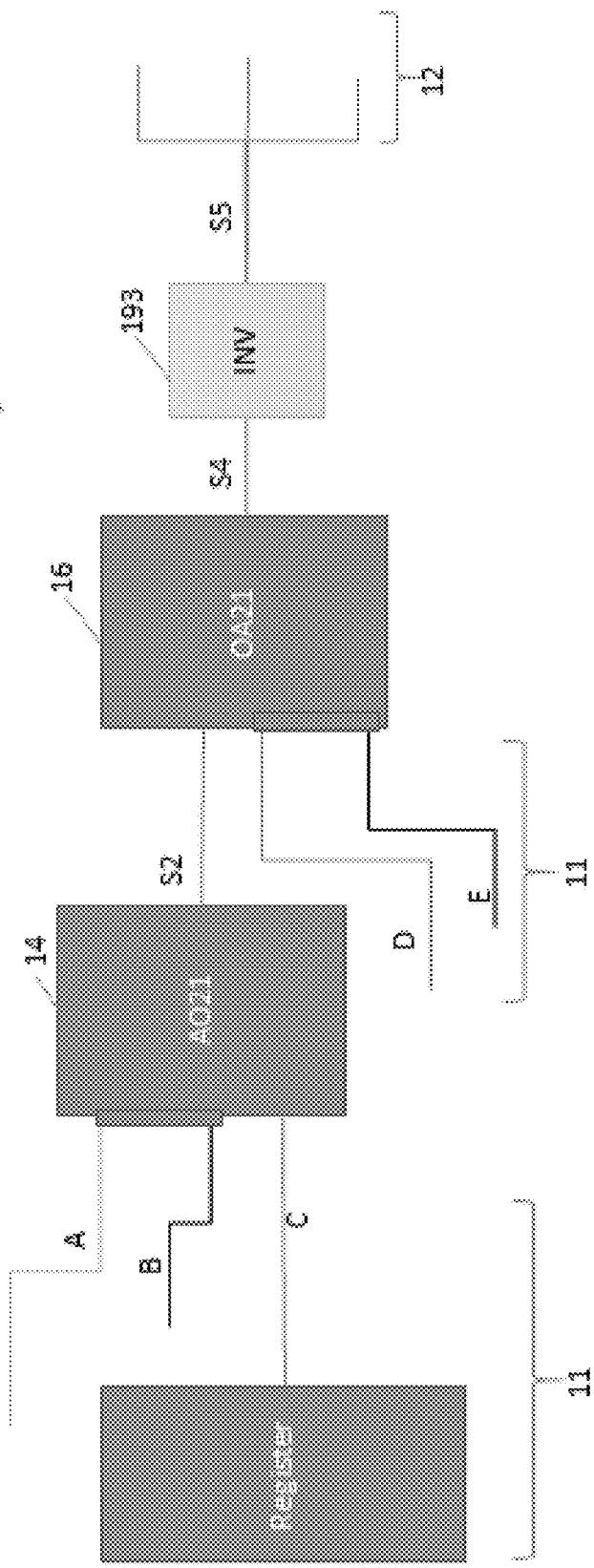

INTEGRATED CIRCUIT LOGIC EXTRACTION USING CLONING AND EXPANSION FOR ENGINEERING CHANGE ORDER

BACKGROUND

The present invention relates to integrated circuit design, and more specifically, to modifying an integrated circuit design in response to an engineering change order.

During a design process for integrated circuits, functional specifications are often modified in the late stages of the design process. This typically occurs after placement and routing are completed. Unfortunately, circuit designers are left to manually process such modifications manually or to start the design process again from the beginning, both of which can be costly. Hence, it would be welcomed by circuit design organizations, if automated processes were developed to implement integrated circuit design modifications that minimized or limited the number of circuit changes required to implement the modifications, especially if the modifications require structural changes.

SUMMARY

According to an embodiment of the present invention, a computer-implemented method for modifying a design of an integrated circuit in accordance with an engineering change order is disclosed. The computer-implemented method includes: receiving an original design of the integrated circuit using a processor; receiving an engineering change order (ECO) design for the integrated circuit using the processor; identifying a complex logic gate comprising two or more logic functions in each of the original design and the ECO design using the processor; cloning the identified complex logic gate with a cloned complex logic gate in parallel with the corresponding identified complex logic gate in each of the original design and the ECO design using the processor; expanding each cloned complex logic gate in each of the original design and the ECO design to corresponding logic gates having a single logic function using the processor to provide an expanded original design and an expanded ECO design using the processor; identifying each input in the expanded original design as being equivalent or non-equivalent to an input the expanded ECO design using the processor; modifying the expanded original design to have a circuit topology that is the same as the expanded ECO design in order to have an input from the expanded original design to an output structure be the same as the input from the expanded ECO design to the output structure in response to identification of an input being non-equivalent; and removing cloned logic gates from the expanded original design to provide a modified original design using the processor.

According to another embodiment of the invention, a system for modifying a design of an integrated circuit in accordance with an engineering change order is disclosed. The system includes a processor and a memory. The processor and memory are configured to receive an original design of the integrated circuit using a processor; receive an engineering change order (ECO) design for the integrated circuit using the processor; identify complex logic gates comprising two or more logic functions in each of the original design and the ECO design using the processor; clone the identified complex logic gates with cloned complex logic gates in parallel with the corresponding identified complex logic gates in each of the original design and the ECO design using the processor; expand each cloned complex logic gate in each of the original design and the ECO design to corresponding logic gates having a single logic function using the processor to provide an expanded original design and an expanded ECO design using the processor; identify each input in the expanded original design as being equivalent or non-equivalent to an input the expanded ECO design using the processor; modify the expanded original design to have a circuit topology that is the same as the expanded ECO design in order to have an input from the expanded original design to an output structure be the same as the input from the expanded ECO design to the output structure in response to identification of an input being non-equivalent; and remove cloned logic gates from the expanded original design to provide a modified original design using the processor.

According to another embodiment of the invention, a computer program product for modifying a design of an integrated circuit in accordance with an engineering change order is disclosed. The computer program product includes a computer readable storage medium having program instructions embodied therewith. The program instructions are executable by a processor to cause the processor to receive an original design of the integrated circuit using a processor; receive an engineering change order (ECO) design for the integrated circuit using the processor; identify complex logic gates comprising two or more logic functions in each of the original design and the ECO design using the processor; clone the identified complex logic gates with cloned complex logic gates in parallel with the corresponding identified complex logic gates in each of the original design and the ECO design using the processor; expand each cloned complex logic gate in each of the original design and the ECO design to corresponding logic gates having a single logic function using the processor to provide an expanded original design and an expanded ECO design using the processor; identify each input in the expanded original design as being equivalent or non-equivalent to an input the expanded ECO design using the processor; modify the expanded original design to have a circuit topology that is the same as the expanded ECO design in order to have an input from the expanded original design to an output structure be the same as the input from the expanded ECO design to the output structure in response to identification of an input being non-equivalent; and remove cloned logic gates from the expanded original design to provide a modified original design using the processor.

BRIEF DESCRIPTION OF THE DRAWINGS

FIGS. 1A and 1B depict aspects of an original circuit design model and an engineering change order (ECO) model that requires changes to the original model;

FIGS. 2A and 2B depict aspects of identifying complex logic gates and cloning them in the original model and the ECO model;

FIGS. 3A and 3B depict aspects of expanding the cloned logic gates to their base functionality in the original model and the ECO model;

FIG. 4 depicts aspects of implementing a design change in the original model in accordance with the expanded cloned logic gates in order for the modified original model to perform the same as the ECO model;

FIG. 5 depicts aspects of cleaning up the modified original model by removing the expanded cloned logic gates to provide a modified original model implementing the ECO;

Figure 6:
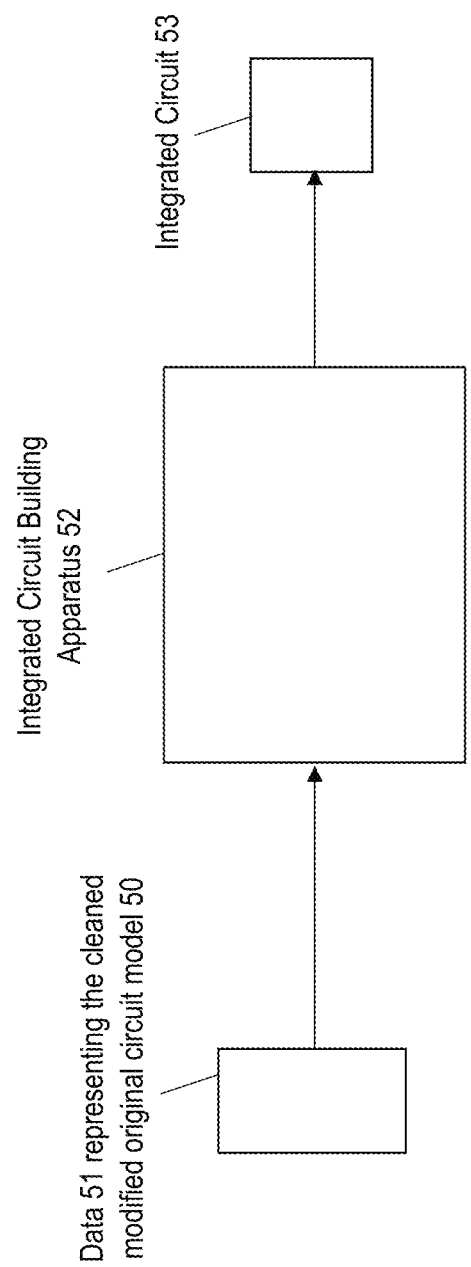
FIG. 6 depicts aspects of building an integrated circuit using the cleaned-up modified original model.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Various embodiments of the invention are described with reference to the related drawings. Alternate embodiments can be devised without departing from the scope of the invention. It is noted that various connections are set forth between elements in the following description and in the drawings. These connections, unless specified otherwise, may be direct or indirect, and the present invention is not intended to be limited in this respect. Accordingly, a coupling of entities can refer to a direct or an indirect connection.

Disclosed are computer-implemented methods, systems, and computer program products for modifying a design of an integrated circuit in accordance with an engineering change order (ECO). While conventional methods for modifying an integrated circuit design require the new design requirements to have a similar structure to the original design, the disclosed methods are applicable to modifying an original design that has undergone structural changes due to the ECO. Hence, the disclosed methods are more flexible in accommodating structural changes than conventional methods.

FIG. 1A depicts aspects of an original circuit model 10. The term "circuit model" may be referred to as a "circuit design." FIG. 1B depicts aspects of an ECO circuit model 15 that requires changes to the original circuit model 10 due to an ECO in order to function as the ECO circuit model 15. The original circuit model 10 includes an input structure 11 and an output structure 12. The input structure 11 includes inputs A, B, D and E and a register 13 providing input C. Various nodes or locations in the circuit models 10 and 15 having a certain logic state, such as "0" or "1", are referred to as "inputs" because the corresponding state is provided as an input to a logic gate or output structure. The input structure 11 and the output structure 12 are the same in both the original circuit model 10 and the ECO model 15.

The original circuit model 10 includes an and-or logic gate 14 that applies the "and" function to inputs A and B and then applies the "or" function to the "and" output. The output of the and-or logic gate 14 is S2. The original circuit model 10 also includes an or-and logic gate 16 that applies the "or" function to inputs D and E and then applies the "and" function to the "or" output. The output of the or-and logic gate 16 is S4, which is an input to the output structure 12. In summary for the original circuit model 10, S1 (internal, not shown) is A and B, S2 is S1 or C, S3 (internal, not shown) is D or E, and S4 is S2 and S3.

The ECO circuit model 15 includes an and-logic gate 17 that applies the "and" function to inputs A and B to provide output S1. The ECO circuit model 15 also includes an or-logic gate 18 that applies the "or" function to inputs E and D to provide output S3. The ECO circuit model 15 further includes an or-and logic gate 19 that applies the "or" function to inputs C and S1 and then applies the "and" function to the "or" output. The output of the or-and logic gate 19 is S5, which is an input to the output structure 12. In summary for the ECO circuit model 15, S1 is A and B, S2 is S1 or C, S3 is D or E, and S4 is S2 and S3, and S5 in "not" S4.

Figures 2A, 2B:
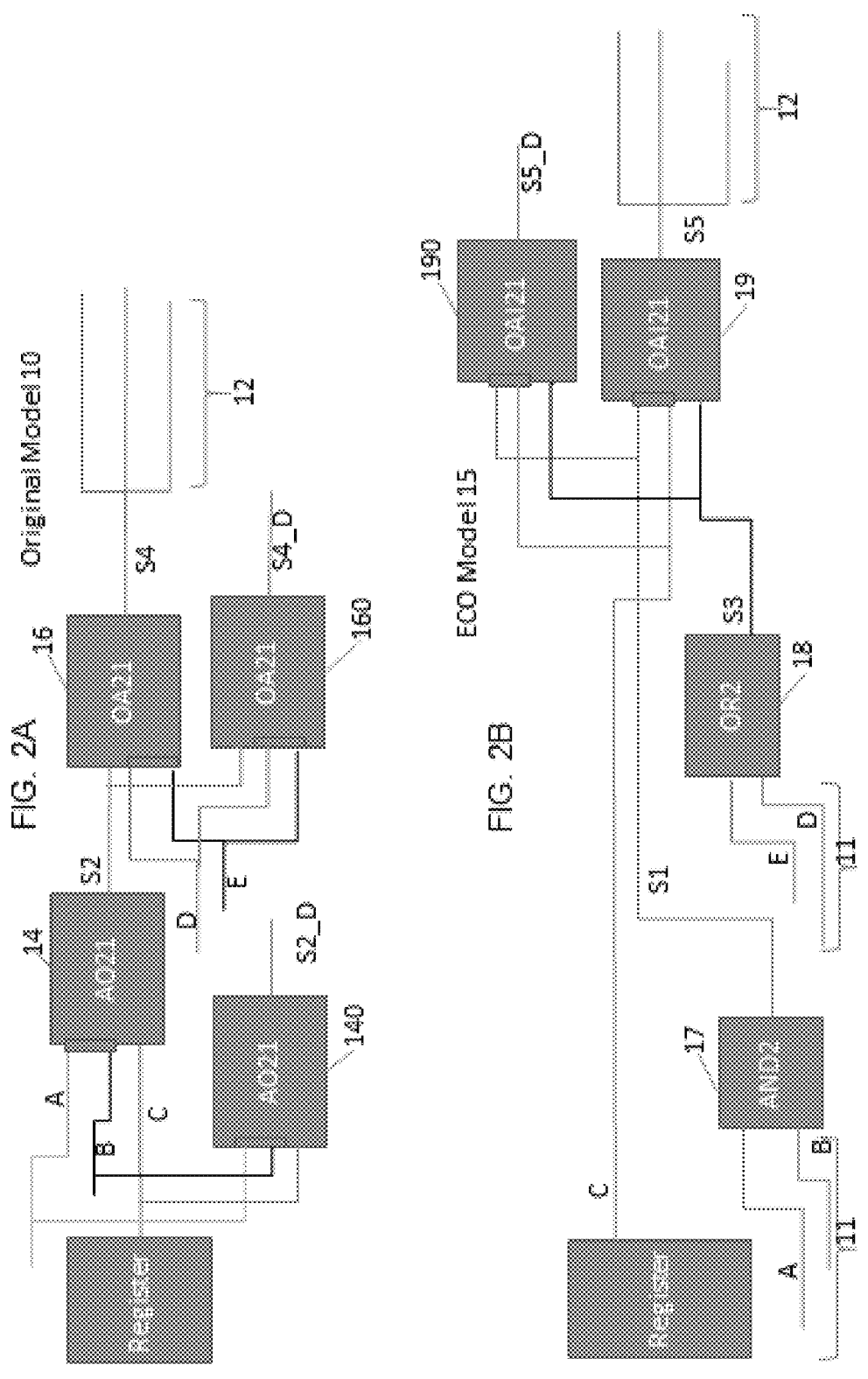

FIGS. 2A and 2B depict aspects of identifying complex logic gates and cloning them in each of the original circuit model 10 and the ECO circuit model 15. The term "complex logic gates" relates to logic gates having two of more logic functions. Non-limiting embodiments of the complex logic gates include "and-or" logic gates, "or-and" logic gates, "and-or-invert" logic gates, "or-and-invert" logic gates, XOR logic gates, XNOR logic gates, NOR logic gates, and NAND logic gates. The term "cloning" relates to inserting identical logic gates in parallel with the logic gates that are being cloned. In the embodiment of FIG. 2A, the and-or logic gate 14 is cloned by a cloned and-or logic gate 140 disposed in parallel with the and-or logic gate 14. Similarly, the or-and logic gate 16 is cloned by a cloned or-and logic gate 160 disposed in parallel with the or-and logic gate 16. In the embodiment of FIG. 2B, the or-and logic gate 19 is cloned by a cloned or-and logic gate 190 disposed in parallel with the or-and logic gate 19.

FIGS. 3A and 3B depict aspects of expanding each of the cloned logic gates to their respective base functionality in the original circuit model 10 and the ECO circuit model 15. In the embodiment of FIG. 3A, the cloned and-or logic gate 140 is expanded to an and-logic gate 141 and an or-logic gate 142 that receives input from the and-logic gate 141. Similarly, the or-and logic gate 160 is expanded to an or-logic gate 161 and an and-logic gate 162 that received input form the or-logic gate 161. In the embodiment of FIG. 3B, the or-and logic gate 190 is expanded to an or-logic gate 191, an and-logic gate 192, and an invert-logic gate 193. The or-and logic gate 191 provides output TE_1, which is input into the and-logic gate 192. The and-logic gate 192 provides output TE_2, which is input into the invert-logic gate 193. The invert-logic gate 193 provides output S_D.

In order to modify the original circuit model 10, the input equivalents between the original circuit model 10 and the ECO circuit model 15 are determined. With respect to the embodiments in FIGS. 3A and 3B, T1 is equivalent to S1, T2 is equivalent to S3, S2 is equivalent TE_1, and S4 is equivalent to TE_2. Output equivalents are also identified. For example, the output structure after S4 is equivalent to the output structure after S5.

Once equivalent inputs and thus non-equivalent inputs are identified, one or more of the expanded logic gates in the ECO circuit model 15 can be disposed in the original circuit model 10 in order to change a non-equivalent input to an equivalent input. FIGS. 4A and 4B depict aspects of modifying the original circuit model 10 in accordance with the expanded cloned logic gates in order for the modified original circuit model 10 to perform the same as the ECO circuit model 15. The original circuit model 10 as modified is referred to as a modified original circuit model 40 in FIG. 4A. In the embodiment of FIGS. 4A and 4B, the input S4 is equivalent to the input TE_2 in the ECO circuit model 15, but not equivalent to the input S5_D in the ECO circuit model 15. Hence, adding the invert-logic gate 193 to the original circuit model 10 after the input S4 will provide output S5 as equivalent to output S5_D in the ECO circuit model 15. Thus, the original circuit model 10 as modified by including the invert-logic gate 193 as illustrated in FIG. 4A will enable the modified original circuit model 40 to act the same as the ECO circuit 15.

FIG. 5 depicts aspects of cleaning up the modified original circuit model 40 by removing the expanded cloned logic gates to provide a cleaned modified original circuit model 50. The cleaned modified original circuit model 50 required the addition of only one logic gate as opposed to prior-art methods that would require the addition of multiple gates to achieve the same functional requirements. The disclosed methodology is especially helpful in ECO circuit models with a lot of restructuring and the ECO circuit model is close to the input structure (i.e., primary inputs and/or register outputs).

FIG. 6 depicts aspects of building an integrated circuit in accordance with the cleaned modified original circuit model 50. In the embodiment of FIG. 6, data 51 representing the cleaned modified original circuit model 50 is entered into an integrated circuit building apparatus 52. The integrated circuit building apparatus 52 is configured to build an integrated circuit 53 that embodies the circuitry represented in the cleaned modified original circuit model 50. In one or more embodiments, the integrated circuit building apparatus 52 uses photolithography techniques as known in the art. In that various integrated circuit building techniques are known in the art, they are not discussed in any further detail.

Figure 7:
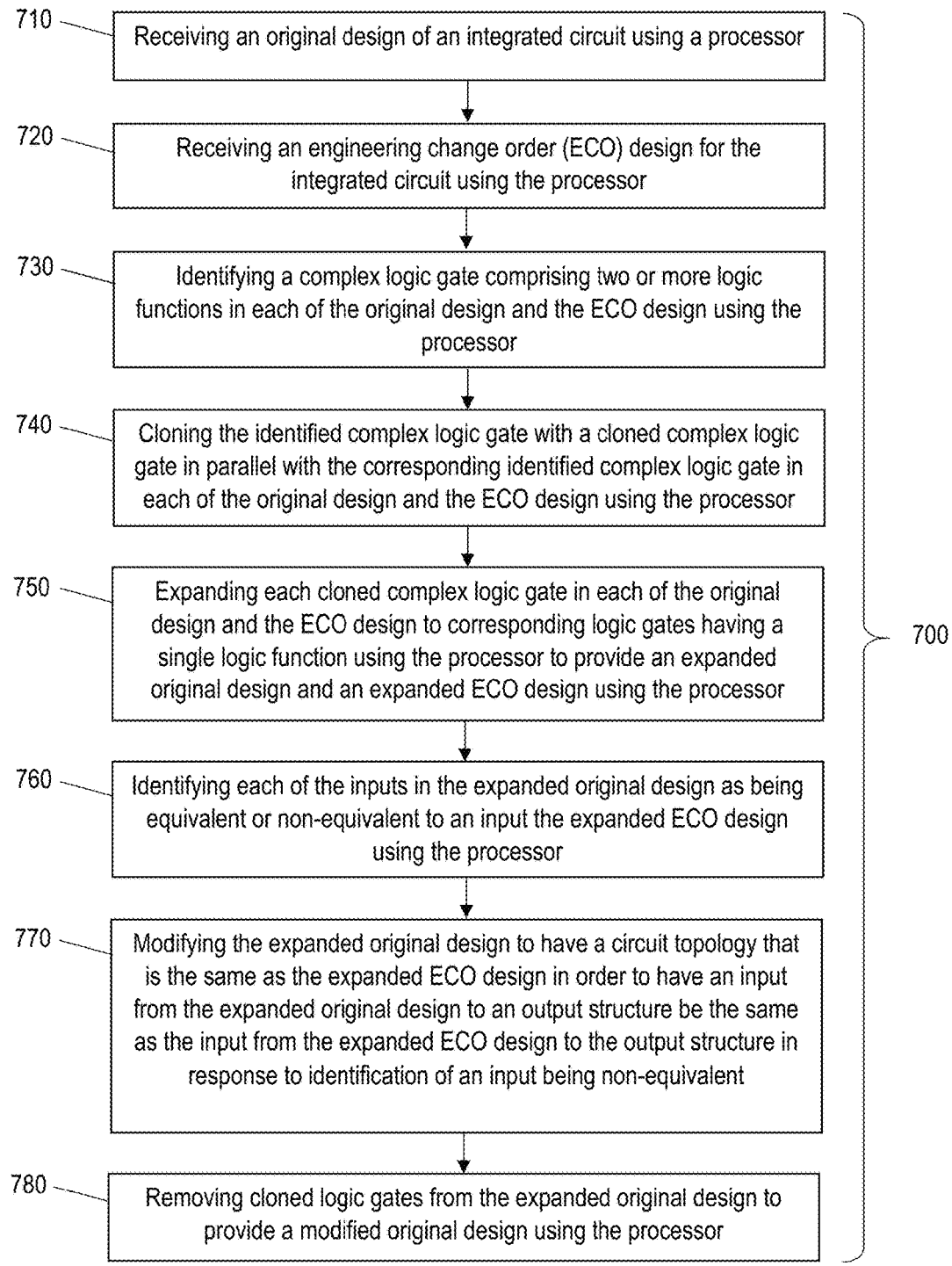
FIG. 7 is a flow diagram of an example embodiment of a method for modifying a design of an integrated circuit in accordance with an engineering change order.

FIG. 7 is a flow diagram of an example embodiment of a method 700 for modifying a design of an integrated circuit in accordance with an engineering change order. Block 710 represents receiving an original design of an integrated circuit using a processor. Block 720 represents receiving an engineering change order (ECO) design for the integrated circuit using the processor. Block 730 represents identifying a complex logic gate comprising two or more logic functions in each of the original design and the ECO design using the processor. Block 740 represents cloning the identified complex logic gate with a cloned complex logic gate in parallel with the corresponding identified complex logic gate in each of the original design and the ECO design using the processor. As used herein, the term "cloning" as relating to a logic gate refers to providing a copy of that logic gate. Block 750 represents expanding each cloned complex logic gate in each of the original design and the ECO design to corresponding logic gates having a single logic function using the processor to provide an expanded original design and an expanded ECO design using the processor. Block 760 represents identifying each of the inputs in the expanded original design as being equivalent or non-equivalent to an input the expanded ECO design using the processor. Block 770 represents modifying the expanded original design to have a circuit topology that is the same as the expanded ECO design in order to have an input from the expanded original design to an output structure be the same as the input from the expanded ECO design to the output structure in response to identification of an input being non-equivalent. Block 780 represents removing cloned logic gates from the expanded original design to provide a modified original design using the processor.

The method 700 may also include building the integrated circuit using an integrated circuit building apparatus in accordance with the modified original design. The ECO process for building an integrated circuit involves extraction of a logic change and stitching it into an existing placed and routed netlist. ECOs are usually done to save the time spent in re-running the entire design through the physical design process.

An ECO build can be performed at the gate-level or metal-level or post-fabrication. These can be categorized into A) front-end-of-line (FEOL) and B) back-end-of-line (BEOL). FEOL involves changes made at both gate-level and metal-level. Standard cells are used for implementing FEOL changes. This usually happens in pre-mask stage.

BEOL, on the other hand, involves changes only at the post-mask level and is performed only at the metal layers. Usually, gate-array (GA) cells are used to process such changes. The GA cells are already present in the design mask, which are then etched/interconnected as required to give the desired functionality.

A gate-array (GA) cell is a prefabricated silicon circuit with no particular function, in which transistors, standard NAND or NOR logic gates, and other active devices are placed at regular predefined positions and manufactured on a wafer. Creation of a circuit with a specified function is accomplished by adding a final surface layer or layers of metal interconnects to the cell late in the manufacturing process, joining these elements to allow the function of the cell to be customized as desired.

Information may be required to flow between disparate applications across multiple hardware and software platforms. One architecture which supports this is Enterprise Service Bus architecture providing integrated connectivity between applications and services in a service-oriented architecture. IBM Integration Bus (formerly WebSphere Message Broker, wherein IBM and WebSphere are trademarks of International Business Machines Corporation) is an example of such an architecture, which allows business information to flow as an integration application with rules applied to the data flowing through an integration node (also referred to as a message broker) to route and transform the information.

Other architectures may include distributed computing in which a distributed system is a software system in which components are located on networked computers and communicate and coordinate their actions by passing messages. Distributed applications may be processed across a distributed computing architecture.

Figure 8:
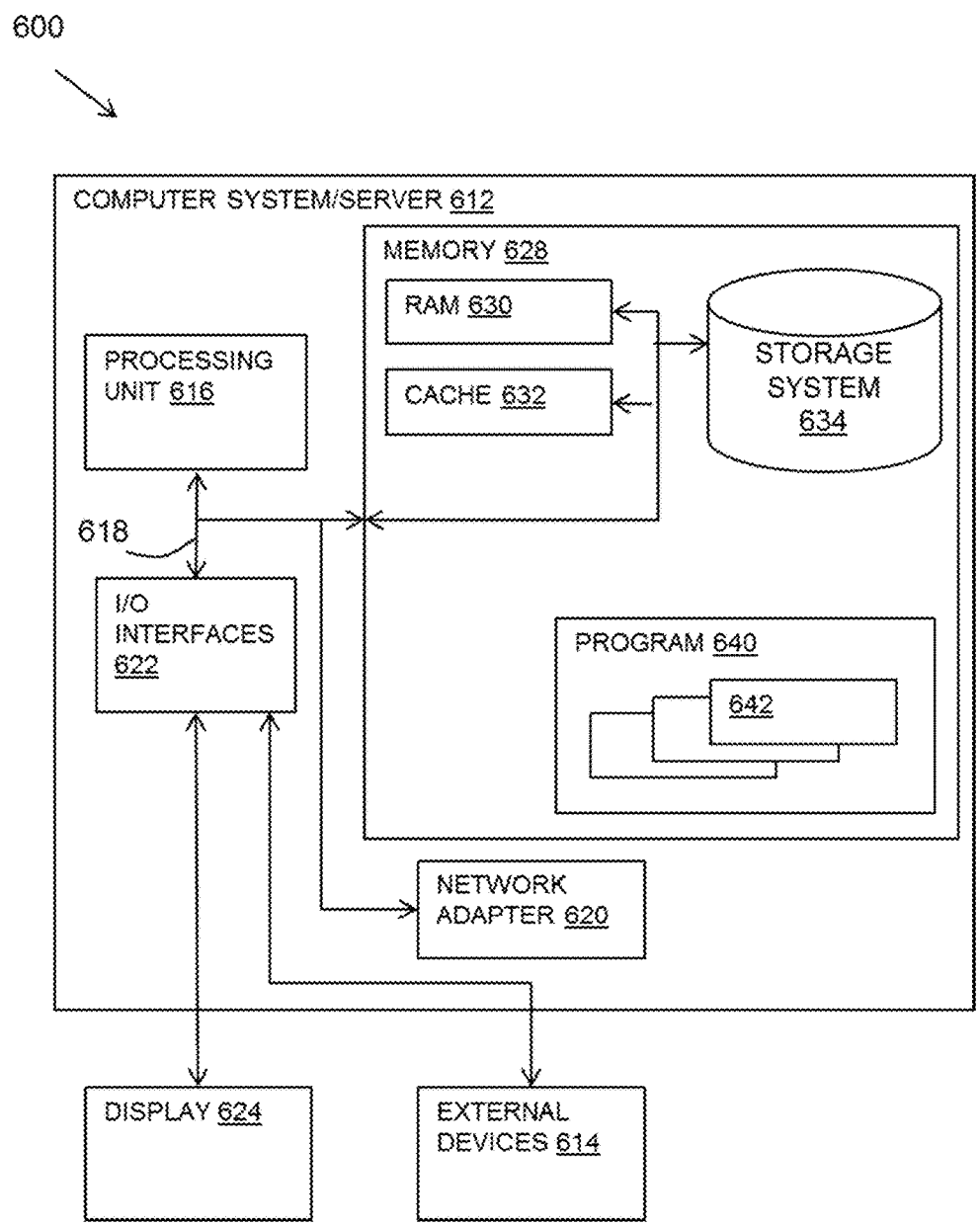
FIG. 8 is a block diagram of an embodiment of a computer system or cloud server in which the present invention may be implemented.

Referring now to FIG. 8, a schematic of an example of a system 600 in the form of a computer system or server is shown. The system 600 represents an embodiment of a circuit design system that can implement the circuit design features discussed above.

A computer system or server 612 may be operational with numerous other general purpose or special purpose computing system environments or configurations. Examples of well-known computing systems, environments, and/or configurations that may be suitable for use with computer system/server 612 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 612 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 612 may be practiced in distributed cloud computing environments where tasks are performed by remote processing devices that are linked through a communications network. In a distributed cloud computing environment, program modules may be located in both local and remote computer system storage media including memory storage devices.

In FIG. 8, a computer system/server 612 is shown in the form of a general-purpose computing device. The components of the computer system/server 612 may include, but are not limited to, one or more processors or processing units 616, a system memory 628, and a bus 618 that couples various system components including system memory 628 to processor 616.

Bus 618 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 612 typically includes a variety of computer system readable media. Such media may be any available media that is accessible by computer system/server 612, and it includes both volatile and non-volatile media, removable and non-removable media.

System memory 628 can include computer system readable media in the form of volatile memory, such as random access memory (RAM) 630 and/or cache memory 632. Computer system/server 612 may further include other removable/non-removable, volatile/non-volatile computer system storage media. By way of example only, storage system 634 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 618 by one or more data media interfaces. As will be further depicted and described below, memory 628 may include at least one program product having a set (e.g., at least one) of program modules that are configured to carry out the functions of embodiments of the invention.

Program/utility 640, having a set (at least one) of program modules 642, may be stored in memory 628 by way of example, and not limitation, as well as an operating system, one or more application programs, other program modules, and program data. Each of the operating system, one or more application programs, other program modules, and program data or some combination thereof, may include an implementation of a networking environment. Program modules 642 generally carry out the functions and/or methodologies of embodiments of the invention as described herein.

Computer system/server 612 may also communicate with one or more external devices 614 such as a keyboard, a pointing device, a display 624, etc.; one or more devices that enable a user to interact with computer system/server 612; and/or any devices (e.g., network card, modem, etc.) that enable computer system/server 612 to communicate with one or more other computing devices. Such communication can occur via Input/Output (I/O) interfaces 622. Still yet, computer system/server 612 can communicate with one or more networks such as a local area network (LAN), a general wide area network (WAN), and/or a public network (e.g., the Internet) via network adapter 620. As depicted, network adapter 620 communicates with the other components of computer system/server 612 via bus 618. It should be understood that although not shown, other hardware and/or software components could be used in conjunction with computer system/server 612. Examples, include but are not limited to: microcode, device drivers, redundant processing units, external disk drive arrays, RAID systems, tape drives, and data archival storage systems, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Cloud Computing

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 9:
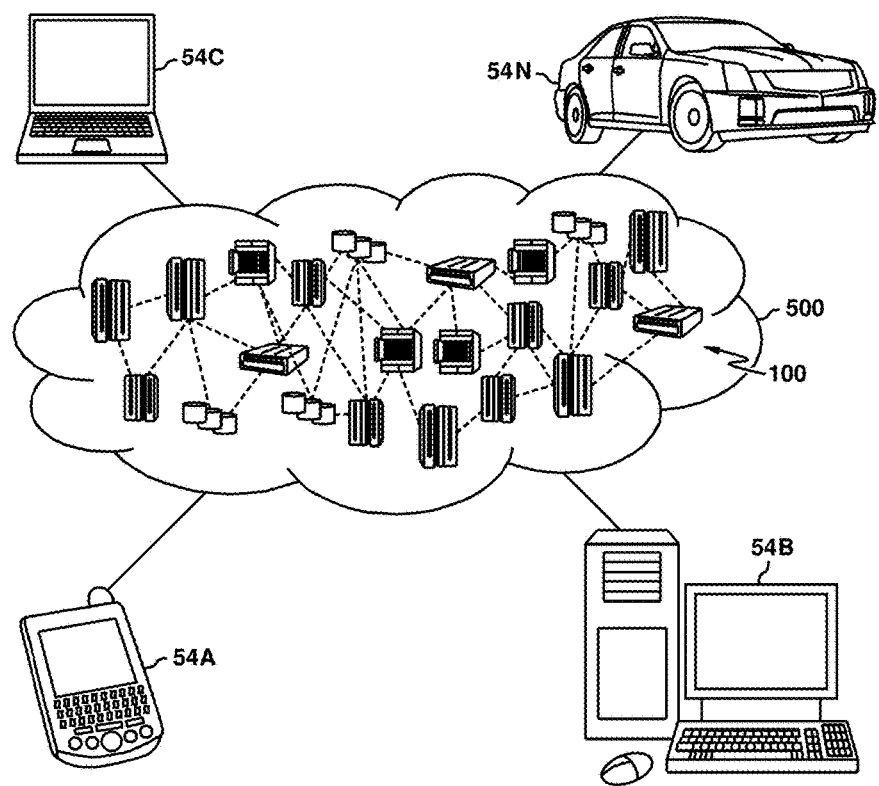
FIG. 9 is a schematic diagram of a cloud computing environment in which the present invention may be implemented.

Referring now to FIG. 9, illustrative cloud computing environment 500 is depicted. As shown, cloud computing environment 500 comprises one or more cloud computing nodes 100 with which local computing devices used by cloud consumers, such as, for example, personal digital assistant (PDA) or cellular telephone 54A, desktop computer 54B, laptop computer 54C, and/or automobile computer system 54N may communicate. Nodes 100 may communicate with one another. They may be grouped (not shown) physically or virtually, in one or more networks, such as Private, Community, Public, or Hybrid clouds as described hereinabove, or a combination thereof. This allows cloud computing environment 500 to offer infrastructure, platforms and/or software as services for which a cloud consumer does not need to maintain resources on a local computing device. It is understood that the types of computing devices 54A-N shown in FIG. 9 are intended to be illustrative only and that computing nodes 100 and cloud computing environment 500 can communicate with any type of computerized device over any type of network and/or network addressable connection (e.g., using a web browser).

Figure 10:
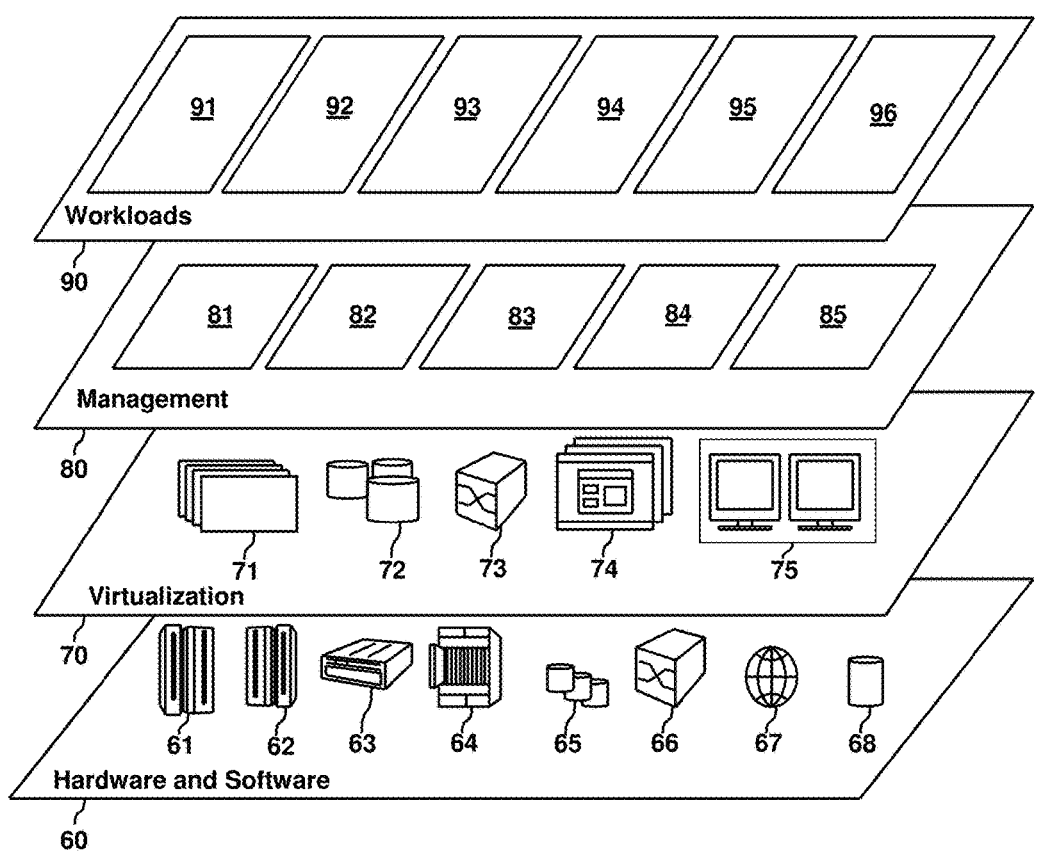
FIG. 10 is a diagram of abstraction model layers of a cloud computing environment in which the present invention may be implemented.

Referring now to FIG. 10, a set of functional abstraction layers provided by cloud computing environment 500 (FIG. 9) is shown. It should be understood in advance that the components, layers, and functions shown in FIG. 9 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and circuit design software 96 for modifying an original circuit design in accordance with an ECO.

Elements of the embodiments have been introduced with either the articles "a" or "an." The articles are intended to mean that there are one or more elements. The terms "including" and "having" and the like are intended to be inclusive such that there may be additional elements other than the elements listed. The term "configured" relates to one or more structural limitations of a device that are required for the device to perform the function or operation for which the device is configured.

The disclosure illustratively disclosed may be practiced in the absence of any element which is not specifically disclosed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method for building a modified integrated circuit based on modifying a design of an original integrated circuit in accordance with an engineering change order, the method comprising:
    receiving an original design of the original integrated circuit using a processor;
    receiving an engineering change order (ECO) design for the original integrated circuit using the processor;
    identifying a complex logic gate comprising two or more logic functions in each of the original design and the ECO design using the processor;
    cloning the identified complex logic gate with a cloned complex logic gate in parallel with the corresponding identified complex logic gate in each of the original design and the ECO design using the processor, wherein the cloned complex logic gate is logically equivalent to the identified complex logic gate;
    expanding each cloned complex logic gate in each of the original design and the ECO design to corresponding logic gates having a single logic function using the processor to provide an expanded original design and an expanded ECO design using the processor;
    identifying each input in the expanded original design as being equivalent or non-equivalent to an input the expanded ECO design using the processor;
    modifying the expanded original design to have a circuit topology that is the same as the expanded ECO design in order to have an input from the expanded original design to an output structure be the same as the input from the expanded ECO design to the output structure in response to identification of an input being non-equivalent;
    removing cloned logic gates from the expanded original design to provide a modified original design using the processor; and
    building the modified integrated circuit using an integrated circuit building apparatus in accordance with the modified original design.

2. The computer-implemented method as claimed in claim 1 wherein the building the integrated circuit comprises fabrication in a pre-mask phase.

3. The computer-implemented method as claimed in claim 1, wherein the building the integrated circuit comprises fabrication in a post-mask phase.

4. The computer-implemented method as claimed in claim 1, wherein the original design includes an input structure that provides an input to the original design and an output structure that receives an input from the original design, the ECO design comprising the same input structure and the same output structure.

5. The computer-implemented method as claimed in claim 1, wherein the complex logic gate comprises (i) an and-or logic gate, (ii) an and-or-invert logic gate, (iii) an or-and logic gate, (iv) an or-and-invert logic gate, (v) an XOR logic gate, (vi) an XNOR logic gate, (vii) a NOR logic gate, or (viii) a NAND logic gate.

6. The computer-implemented method as claimed in claim 1, wherein the corresponding logic gates having a single logic function comprise (i) an and-logic gate, (ii) an or-logic gate, or (iii) an invert-logic gate.

7. The computer-implemented method as claimed in claim 1, wherein modifying comprises adding an input to a logic gate, deleting an input to a logic gate, deleting a logic gate, and/or inserting a logic gate from the expanded ECO design into a corresponding location in the expanded original design such that the modifying converts the non-equivalent input into an equivalent input using the processor.

8. A system for building a modified integrated circuit based on modifying a design of an original integrated circuit in accordance with an engineering change order, the system comprising:
    a processor and a memory configured to:
    receive an original design of the original integrated circuit using a processor;
    receive an engineering change order (ECO) design for the original integrated circuit using the processor;
    identify complex logic gates comprising two or more logic functions in each of the original design and the ECO design using the processor;
    clone the identified complex logic gates with cloned complex logic gates in parallel with the corresponding identified complex logic gates in each of the original design and the ECO design using the processor, wherein the cloned complex logic gates are logically equivalent to the corresponding identified complex logic gates;
    expand each cloned complex logic gate in each of the original design and the ECO design to corresponding logic gates having a single logic function using the processor to provide an expanded original design and an expanded ECO design using the processor;
    identify each of the inputs in the expanded original design as being equivalent or non-equivalent to an input the expanded ECO design using the processor;
    modify the expanded original design to have a circuit topology that is the same as the expanded ECO design in order to have an input from the expanded original design to an output structure be the same as the input from the expanded ECO design to the output structure in response to identification of an input being non-equivalent; and
    remove cloned logic gates from the expanded original design to provide a modified original design using the processor;

an integrated circuit building apparatus configured to build the modified integrated circuit according to the modified original design.

9. The system as claimed in claim 8, wherein the original design includes an input structure that provides an input to the original design and an output structure that receives an input from the original design, the ECO design comprising the same input structure and the same output structure.

10. The system as claimed in claim 8, wherein the complex logic gate comprises (i) an and-or logic gate, (ii) an and-or-invert logic gate, (iii) an or-and logic gate, (iv) an or-and-invert logic gate, (v) an XOR logic gate, (vi) an XNOR logic gate, (vii) a NOR logic gate, or (viii) a NAND logic gate.

11. The system as claimed in claim 8, wherein the corresponding logic gates having a single logic function comprise (i) an and-logic gate, (ii) an or-logic gate, or (iii) an invert-logic gate.

12. The system as claimed in claim 8, wherein modify comprises addition of an input to a logic gate, deletion of an input to a logic gate, deletion of a logic gate, and/or insertion of a logic gate from the expanded ECO design into a corresponding location in the expanded original design such that the modification converts the non-equivalent input into an equivalent input using the processor.

13. A computer program product for building a modified integrated circuit based on modifying a design of an original integrated circuit in accordance with an engineering change order, the computer program product comprising a computer readable storage medium having program instructions embodied therewith, the program instructions executable by a processor to cause the processor to:
receive an original design of the original integrated circuit using a processor;
receive an engineering change order (ECO) design for the original integrated circuit using the processor;
identify complex logic gates comprising two or more logic functions in each of the original design and the ECO design using the processor;
clone the identified complex logic gates with cloned complex logic gates in parallel with the corresponding identified complex logic gates in each of the original design and the ECO design using the processor, wherein the cloned complex logic gates are logically equivalent to the corresponding identified complex logic gates;
expand each cloned complex logic gate in each of the original design and the ECO design to corresponding logic gates having a single logic function using the processor to provide an expanded original design and an expanded ECO design using the processor;
identify each of the inputs in the expanded original design as being equivalent or non-equivalent to an input the expanded ECO design using the processor;
modify the expanded original design to have a circuit topology that is the same as the expanded ECO design in order to have an input from the expanded original design to an output structure be the same as the input from the expanded ECO design to the output structure in response to identification of an input being non-equivalent; and
remove cloned logic gates from the expanded original design to provide a modified original design using the processor;
wherein the program instructions executable by a processor further cause the processor to provide the modified original design to an integrated circuit building apparatus builds the integrated circuit according to the modified original design.

14. The computer program product as claimed in claim 13, wherein the original design includes an input structure that provides an input to the original design and an output structure that receives an input from the original design, the ECO design comprising the same input structure and the same output structure.

15. The computer program product as claimed in claim 13, wherein the complex logic gate comprises (i) an and-or logic gate, (ii) an and-or-invert logic gate, (iii) an or-and logic gate, (iv) an or-and-invert logic gate, (v) an XOR logic gate, (vi) an XNOR logic gate, (vii) a NOR logic gate, or (viii) a NAND logic gate.

16. The computer program product as claimed in claim 13, wherein the corresponding logic gates having a single logic function comprise (i) an and-logic gate, (ii) an or-logic gate, or (iii) an invert-logic gate.

17. The computer program product as claimed in claim 13, wherein modify comprises addition of an input to a logic gate, deletion of an input to a logic gate, deletion of a logic gate, and/or insertion of a logic gate from the expanded ECO design into a corresponding location in the expanded original design such that the modification converts the non-equivalent input into an equivalent input using the processor.

* * * * *